United States Patent
Lopez et al.

(10) Patent No.: US 11,038,571 B2
(45) Date of Patent: Jun. 15, 2021

(54) COMMUNICATION NODE AND METHOD FOR GENERATING BEAMFORMED SIGNALS BY BACKSCATTERING

(71) Applicant: Telefonaktiebolaget LM Ericsson (publ), Stockholm (SE)

(72) Inventors: Miguel Lopez, Solna (SE); Thomas Olsson, Karlshamn (SE); Leif Wilhelmsson, Lund (SE)

(73) Assignee: TELEFONAKTIEBOLAGET LM ERICSSON (publ), Stockholm (SE)

( * ) Notice: Subject to any disclaimer, the term of this patent is extended or adjusted under 35 U.S.C. 154(b) by 0 days.

(21) Appl. No.: 16/639,579

(22) PCT Filed: Sep. 12, 2017

(86) PCT No.: PCT/EP2017/072820
§ 371 (c)(1),
(2) Date: Feb. 16, 2020

(87) PCT Pub. No.: WO2019/052626
PCT Pub. Date: Mar. 21, 2019

(65) Prior Publication Data
US 2021/0135721 A1    May 6, 2021

(51) Int. Cl.
*H04B 7/06* (2006.01)
*H04B 7/08* (2006.01)
(Continued)

(52) U.S. Cl.
CPC ........... *H04B 7/0617* (2013.01); *H03F 3/608* (2013.01); *H04B 1/04* (2013.01); *H04B 5/0031* (2013.01);
(Continued)

(58) Field of Classification Search
CPC ....... H04B 7/0617; H04B 7/084; H04B 7/088
See application file for complete search history.

(56) References Cited

U.S. PATENT DOCUMENTS

2012/0307875 A1\* 12/2012 Maguire ................ H01Q 21/28
375/219
2016/0164548 A1   6/2016 Deyle
2016/0365890 A1  12/2016 Reynolds et al.

OTHER PUBLICATIONS

PCT International Search Report, dated May 17, 2018, in connection with International Application No. PCT/EP2017/072820 all pages.

(Continued)

*Primary Examiner* — Kevin Kim
(74) *Attorney, Agent, or Firm* — Leffler Intellectual Property Law, PLLC (57) ABSTRACT

A wireless communication node and method therein for generating beamformed signals by means of backscattering in a wireless communication network are disclosed. The wireless communication node receives a radio frequency signal at a plurality A of antennas. Each antenna is coupled to one of a number of impedance matrices by one of a plurality A of switches. The wireless communication node generates a first baseband signal based on data symbols to be transmitted in a baseband signal generator. The states of each switch are controlled based on its specific switch control signal such that each antenna impedance is selected among a number M of impedances, and thereby the received RF signal at each antenna is modulated by the first baseband signal with its specific phase and reflected. The beamformed signals are generated by the plurality A of antennas by reflecting the modulated RF signals from each antenna.

10 Claims, 6 Drawing Sheets

(51) Int. Cl.
    *H04B 5/00*     (2006.01)
    *H03F 3/60*     (2006.01)
    *H04B 1/04*     (2006.01)
    *H04W 4/80*     (2018.01)

(52) U.S. Cl.
    CPC ............... *H04B 7/08* (2013.01); *H04W 4/80* (2018.02); *H04B 2001/0408* (2013.01)

(56) References Cited

OTHER PUBLICATIONS

PCT Written Opinion, dated May 17, 2018, in connection with International Application No. PCT/EP2017/072820, all pages.
Bryce Kellogg et al., Passive Wi-Fi: Bringing Low Power to Wi-Fi Transmissions; https://homes.cs.washington.edu/~gshyam/Papers/passive_wifi.pdf; Date Unknown; 14 pages.
Joshua F. Ensworth et al., "Every Smart Phone is a Backscatter Reader: Modulated Backscatter Compatibility with Bluetooth 4.0 Low Energy (BLE) Devices", 2015 IEEE International Conference on RFID, Apr. 15-17, 2015, 5 pages.
Stewart J. Thomas et al., "Quadrature Amplitude Modulated Backscatter in Passive and Semipassive UHF RFID Systems", IEEE Transactions on Microwave Theory and Techniques, vol. 60, No. 4, Apr. 2012, pp. 1175-1182.
John Kimionis et al., "Enhancement of RF Tag Backscatter Efficiency With Low-Power Reflection Amplifiers", IEEE Transactions on Microwave Theory and Techniques, vol. 62, No. 12, Dec. 2014, pp. 3562-3571.

* cited by examiner

COMMUNICATION NODE AND METHOD FOR GENERATING BEAMFORMED SIGNALS BY BACKSCATTERING

TECHNICAL FIELD

Embodiments herein relate to a wireless communication node and method therein for generating beamformed signals. In particular, the embodiments relate to generation of beamformed signals in a passive or semi-passive device by backscattering.

BACKGROUND

Semi-passive and passive transmitters have been used in varies applications. Passive transmitters are powered entirely by the energy received from an incoming RF signal. Semi-passive transmitters have a battery and consume power to perform baseband processing, but lack a power amplifier and many other components present in a transmitter radio frequency (RF) signal chain. Thus, both passive and semi-passive transmitters are power efficient.

The main idea with the semi-passive and passive transmitters is to delegate the generation of RF carriers to an external node that is mains powered. This implies that no power hungry power amplifiers, filters, mixers and other components are needed in the semi- or passive device. The semi- or passive devices generate transmitting signals by using an antenna mismatched to the incoming RF carrier signal, thus reflecting or backscattering the incoming radio waves, and by modulating the reflected electromagnetic waves in order to transmit data to a receiving unit.

Passive and semi-passive devices have good potential in Internet of Things (IoT) applications, due to their power efficiency. For example, in Kellog. et al, "*Passive WiFi: Bringing Low Power to Wi-Fi Transmissions*", University of Washington, it is shown how to implement a power efficient semi-passive device compliant with the IEEE 802.11b standard. In Ensworth J. F., Reynolds M. S., "*Every smart phone is a backscatter reader: Modulated backscatter compatibility with Bluetooth 4.0 Low Energy (BLE) devices*", Radio Frequency Identification (RFID), 2015 IEEE International Conference, 15-17 Apr. 2015, it is shown how to modify passive RFID tags so that the reflected signal can be received by ordinary off-the-shelf Bluetooth Low Energy (BLE) receivers.

A problem with passive and semi-passive generation of RF signals by means of backscattering is that the power of the reflected waves is usually quite small. This is especially an issue in unlicensed bands, where the RF tone generator has a transmitting power limited by regulations targeting short range devices, i.e. equivalent isotropically radiated power (EIRP) is limited to 30 dBm or less, depending on the region. Hence, the range of the passive/semi-passive devices is quite limited. This limits the usability of these type of devices.

As an example, if the RF generator is located at a distance of 5 meters from the semi-passive device and has a transmitting power of 14 dBm, then the backscattered power is approximately −42 dBm. As a comparison, the BLE specification ensures that BLE devices have a transmitting power varying between −20 dBm and +10 dBm.

SUMMARY

It is therefore an object of embodiments herein to provide an improved method and apparatus for passive and semi-passive generation of RF signals by means of backscattering in a wireless communication network.

According to a first aspect of embodiments herein, the object is achieved by a wireless communication node for generating beamformed signals by means of backscattering in a wireless communication network.

The wireless communication node comprises a plurality A of antennas configured to receive a radio frequency, RF, signal with a carrier frequency.

The wireless communication node further comprises a plurality A of switches, each switch has a number M of states.

The wireless communication node further comprises a number of impedance matrices, each impedance matrix comprises a number M of impedances. Each antenna is coupled to one of the impedance matrix by one of the plurality A switches.

The wireless communication node further comprises a baseband signal generator configured to generate a first baseband signal based on data symbols to be transmitted.

The wireless communication node further comprises a plurality A of switch controllers. Each switch controller is configured to generate a specific switch control signal for one of the plurality A switches by phase shifting the first baseband signal with an antenna specific phase. The states of each switch are controlled based on its specific switch control signal such that each antenna impedance is selected among the number M of impedances, and thereby the received RF signal at each antenna is modulated by the first baseband signal with its specific phase and reflected. The beamformed signals are thus generated by the plurality A of antennas by reflecting the modulated RF signals from each antenna.

According to a second aspect of embodiments herein, the object is achieved by a method performed in wireless communication node for generating beamformed signals by means of backscattering in a wireless communication network.

The wireless communication node receives a radio frequency signal at a plurality A of antennas. Each antenna is coupled to one of a number of impedance matrices by one of a plurality A of switches. Each impedance matrix comprises a number M of impedances. The wireless communication node generates a first baseband signal based on data symbols to be transmitted in a baseband signal generator. The wireless communication node controls the states of each switch based on its specific switch control signal such that each antenna impedance is selected among a number M of impedances such that the received RF signal at each antenna is modulated by the first baseband signal with its specific phase and reflected. The beamformed signals are generated by the plurality A of antennas by reflecting the modulated RF signals from each antenna.

According to embodiments herein, the use of multiple reflecting antennas, together with co-phasing, i.e. beamforming, to extend the transmitting range of a wireless communication node, i.e. a passive or semi-passive device.

Beamforming with reflecting antennas has advantages in terms of improved coverage. Unlike classical active transmitters, the power consumption is increased only slightly when the number of antennas is increased, since there are no power amplifiers, filters or other power hungry components in the transmitter chain. Doubling the number of antennas doubles the reflected power. That is a power gain of up to 3 dB can be obtained when doubling the number of antennas. Moreover, if the phases of the reflected signals from the different antennas can be aligned, a gain of 6 dB can instead be obtained by doubling the number of antennas.

It has been reported in prior art that a transmitter in passive Wi-Fi systems consumes several orders of magnitude less, e.g. 1000 times less, power than a transmitter in ordinary Wi-Fi systems. Even though beamforming requires an increase in baseband processing and switching, the increase in power consumption should be tolerable in many IoT applications, given the magnitude of the transmitting power gains.

Therefore, the embodiments herein provide an improved method and apparatus for generation of RF signals in passive and semi-passive devices.

BRIEF DESCRIPTION OF THE DRAWINGS

Examples of embodiments herein are described in more detail with reference to attached drawings in which.

DETAILED DESCRIPTION

Figure 1:
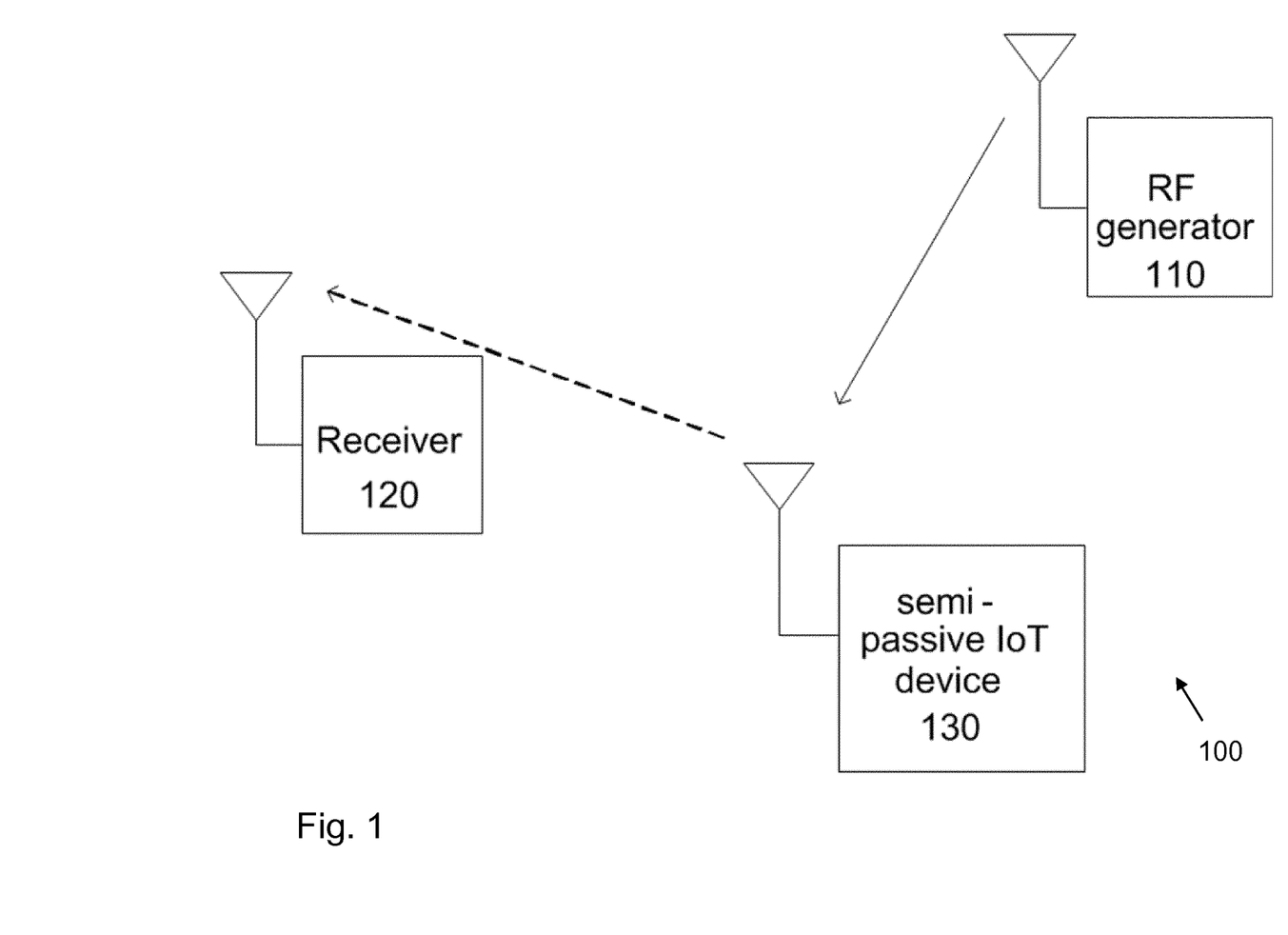
FIG. 1 is a schematic block diagram illustrating embodiments of a wireless communication network in which embodiments herein may be implemented.

FIG. 1 depicts an example of a wireless communication network 100 in which embodiments herein may be implemented. The wireless communication network 100 may be any wireless system or cellular network, such as a Long Term Evolution (LTE) network, any 3$^{rd}$ Generation Partnership Project (3GPP) cellular network, Worldwide interoperability for Microwave Access (Wimax) network, Wireless Local Area Network (WLAN/Wi-Fi), an LTE advanced or Fourth Generation (4G) network, a Fifth Generation (5G) or New Radio (NR) network or Bluetooth/Bluetooth Low Energy (BLE) network etc.

The wireless communication network 100 comprises different type of wireless communication nodes, such as an RF generator 110, a receiver 120, a semi-passive or passive IoT device 130. The semi-passive or passive IoT device 130 receives an RF carrier signal from the RF generator 110 which is an external node that is mains powered. The RF generator 110 may be any device transmitting an RF signal at high enough power level and correct frequency to be used for RF reflection by the semi-passive device 130. The IoT device 130 generates transmitting signals by using an antenna mismatched to the incoming RF carrier signal, thus reflecting or backscattering the incoming radio waves and by modulating the reflected electromagnetic waves in order to transmit data to a receiving unit, e.g. the receiver 120. The dashed line indicates backscattered radio waves.

As part of developing embodiments herein, a semi-passive device related to prior art and principle of RF carrier generation by backscattering will first be described.

Figure 2:
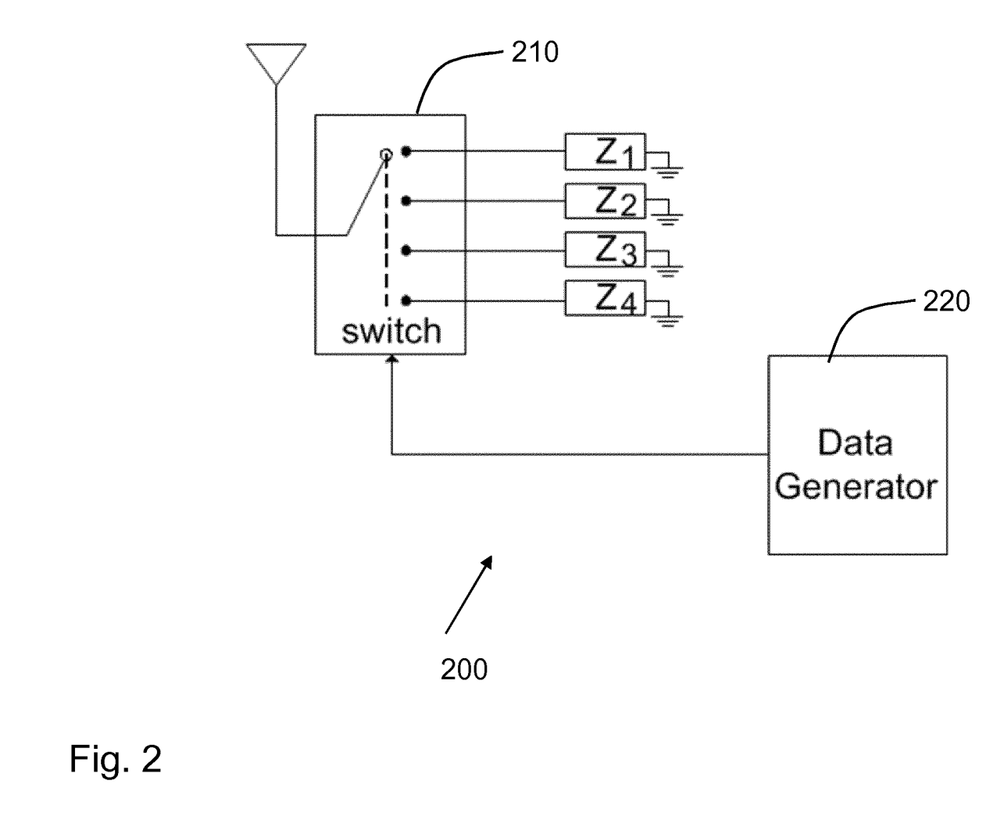
FIG. 2 is a schematic block diagram showing basic transmitter architecture of a semi-passive device.

FIG. 2 shows a basic transmitter architecture of a semi-passive device 200. The semi-passive device 200 comprises 4 antenna impedances, labeled Z1 to Z4, and one switch 210.

Each impedance imparts a different phase shift to the reflected signal. By tuning these impedances it is possible to obtain any desired phase shifts, for example from a 4 Phase Shift Keying (PSK) constellation labeled 4PSK={0,π/2,π3/2}. Table 1 illustrates an example of relation between antenna impedance and phase shifts.

TABLE 1

| Antenna impedance | Phase shift imparted on reflected wave [rads] |
|---|---|
| $Z_1$ | 0 |
| $Z_2$ | π/2 |
| $Z_3$ | π |
| $Z_4$ | 3π/2 |

The switch has 4 states, corresponding to the 4 impedances. A data generator 220 generates control signal to the switch 210 based on data to be transmitted. Thus, by modulating the state of the switch, 4-PSK can be employed to transmit data, simply by changing the state of the switch at the baud rate.

In summary, given a data symbol $\varphi_k \in$ 4PSK, a switch chooses an antenna impedance Zi such that an incoming RF carrier signal, $\cos(2\pi f_c t)$ with frequency $f_c$, results in a reflected radio wave $\cos(2\pi f_c t + \varphi_k)$.

This idea can be modified or extended, and more general modulations, including M-ary Quadrature Amplitude Modulation (M-QAM), can be generated by backscattering. A simpler transmitter with a two-state switch and two impedances is enough to generate Binary PSK (BPSK) or On-Off Keying (OOK).

Example of embodiments of a wireless communication node for generating beamformed signals by means of backscattering in a wireless communication network 100 will now be described with reference to FIG. 3.

According to one embodiment, the wireless communication node 300 comprises a plurality A of antennas 310 configured to receive a radio frequency (RF) signal with a carrier frequency (fc).

The wireless communication node 130 further comprises a plurality A of switches 320, each switch has a number M of states.

The wireless communication node 300 further comprises a number of impedance matrices 330, each impedance matrix comprises a number M of impedances Z1, Z2 . . . . Each antenna is coupled to one of the impedance matrices by one of the plurality A switches.

The wireless communication node 300 further comprises a baseband signal generator 340 configured to generate a first baseband signal based on data symbols $\varphi_k$, k=1, . . . K, to be transmitted.

The wireless communication node 300 further comprises a plurality A of switch controllers 350. Each switch controller is configured to generate a specific switch control signal for one of the plurality A switches by phase shifting the first baseband signal with an antenna specific phase $\theta_a$, a=1, . . . A. The states of each switch are controlled based on its specific switch control signal such that each antenna impedance is selected among the number M of impedances. The received RF signal at each antenna is thus modulated by the first baseband signal with its specific phase $\theta_a$ and reflected. The beamformed signals are thus generated by the plurality A of antennas by reflecting the modulated RF signals from each antenna.

Figure 3:
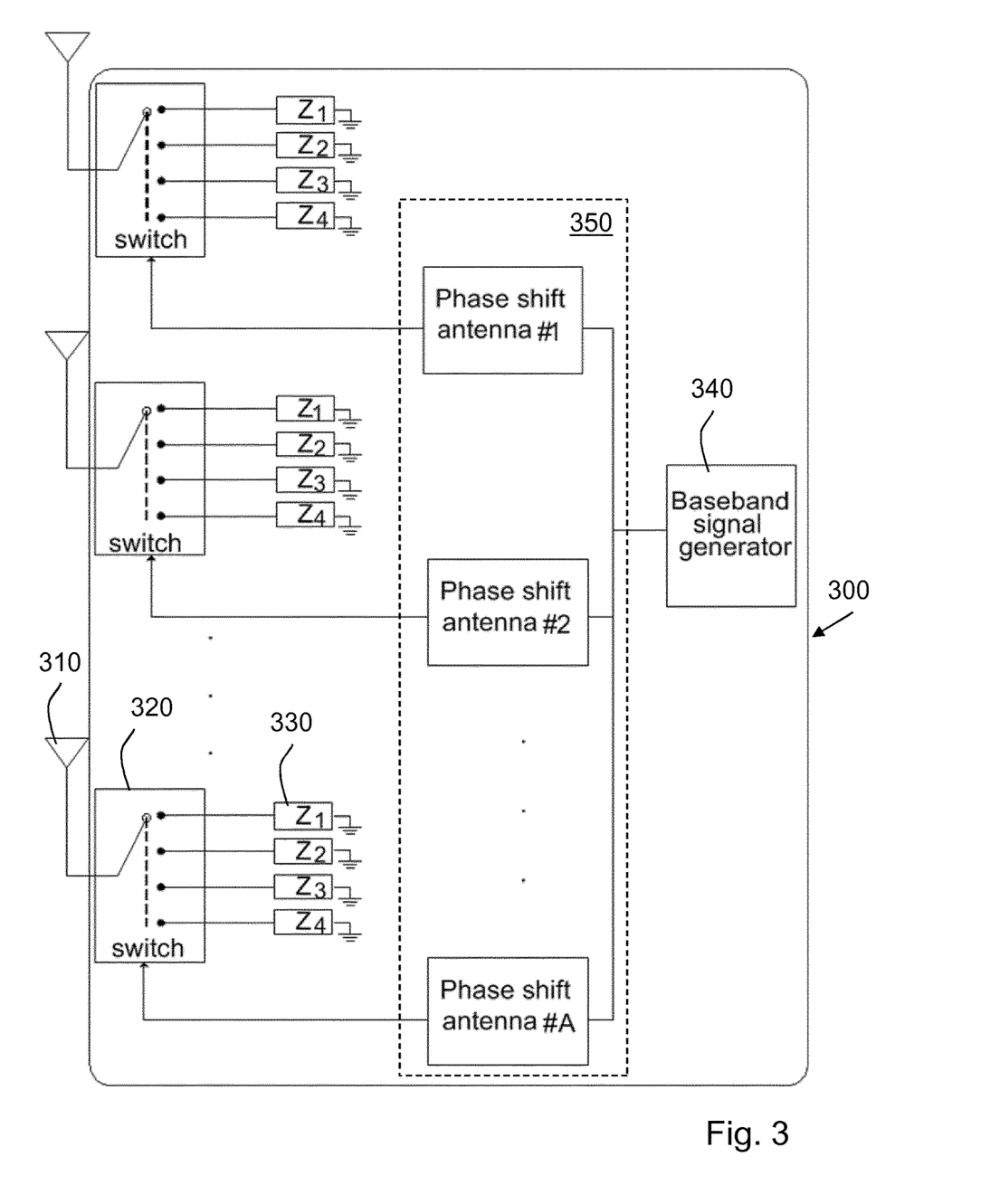
FIG. 3 is a schematic block diagram showing a wireless communication node according to embodiments herein.

In the example embodiment shown in FIG. 3, a semi-passive or passive device is provided with a plurality A of reflecting antennas. Each antenna or more generally group of antennas or antenna ports is coupled to a variable impedance by means of a switch. The switch can be in any of M states, corresponding to M different impedances. An example with M=4 is shown in FIG. 3.

Notice that the baseband signal generator 340 is coupled to the switch controller 350 to implement phase shift based on data symbols to be transmitted and phase shift to be applied on each antenna based on beamforming weights. In the following, phase shift will be explained in detail.

Suppose that it is desired to transmit data symbols $\theta_k \in$ MPSK, k=1, ..., K at a given baud rate. The data is beamformed by choosing suitable weights $\theta_a$, a=1, ..., A. Notice that there is one weight for each antenna port. The choice of beamforming weights is well known in the art and will not be discussed here.

According to one embodiment, the beamforming weights are restricted to belong to an MPSK constellation, MPSK={0, 2π/M, 2*2π/M, ..., (M−1)*2π/M}:

$$\theta_a \in \text{MPSK}, a=1, \ldots, A.$$

For each antenna port, the data symbols $\varphi_k$ are phase shifted by $\theta_a$, generating new MPSK symbols $\alpha_{k,a}$, according to the following expression:

$$\varphi_k + \theta_a \equiv \alpha_{k,a} (\text{mod } 2\pi) \in \text{MPSK}$$

During the k-th signaling interval the switch sets the impedance of the a-th antenna, a=1, ..., A, to the value $Z_i$ that yields the phase shift $\alpha_{k,a}$. This is possible since $\alpha_{k,a} \in$ MPSK. Referring to FIG. 3, the baseband signal generator 340 takes as input the data or code bits to be transmitted and maps them to a sequence of MPSK symbols $\{\varphi_k: k=1, \ldots, K\}$. For each antenna port, these symbols are further transformed to generate the sequence of MPSK symbols $\{\alpha_{k,a}: k=1, \ldots, K; a=1, \ldots, A\}$, i.e. the switch control signals, by the switch controllers 350. The switch control signal #a, i.e. the sequence $\{\alpha_{k,a}: k=1, \ldots, K\}$ is fed to the switch #a connected to antenna port #a to control the states of the switch #a. The switch #a changes state at the baud rate, ensuring that the antenna has an impedance resulting in reflected waves from the antenna #a having a phase $\alpha_{k,a}$ during the k-th signalling period.

As a concrete example, consider a 4 states switch that can generate 4PSK={0, π/2, π, 3π/2} signals from one antenna, as described above. Table 1 illustrates how the switch sets the impedances at each antenna port, given values of the data symbol $\varphi_k$ and the beamforming weight $\theta_a$.

TABLE 1

Example of modulation of switch states that incorporate both PSK data symbols $\varphi_k$ for data transfer and phase shifts $\theta_a$ for co-phasing

| Data symbol to be transmitted during k-th signaling interval $\varphi_k$ | Phase shift to be applied at antenna # a: $\theta_a$ | Phase shift imparted to RF signal: $\alpha_{k,a}$ | Impedance $Z_i$ set by switch corresponding to antenna # a |
|---|---|---|---|
| 0 | 0 | 0 | $Z_1$ |
| π/2 | 0 | π/2 | $Z_2$ |
| π | 0 | π | $Z_3$ |
| 3π/2 | 0 | 3π/2 | $Z_4$ |
| 0 | π/2 | π/2 | $Z_2$ |
| π/2 | π/2 | π | $Z_3$ |
| π | π/2 | 3π/2 | $Z_4$ |
| 3π/2 | π/2 | 0 | $Z_1$ |
| 0 | π | π | $Z_3$ |
| π/2 | π | 3π/2 | $Z_4$ |
| π | π | 0 | $Z_1$ |
| 3π/2 | π | π/2 | $Z_2$ |

TABLE 1-continued

Example of modulation of switch states that incorporate both PSK data symbols $\varphi_k$ for data transfer and phase shifts $\theta_a$ for co-phasing

| Data symbol to be transmitted during k-th signaling interval $\varphi_k$ | Phase shift to be applied at antenna # a: $\theta_a$ | Phase shift imparted to RF signal: $\alpha_{k,a}$ | Impedance $Z_i$ set by switch corresponding to antenna # a |
|---|---|---|---|
| 0 | 3π/2 | 3π/2 | $Z_4$ |
| π/2 | 3π/2 | 0 | $Z_1$ |
| π | 3π/2 | π/2 | $Z_2$ |
| 3π/2 | 3π/2 | π | $Z_3$ |

Neglecting the amplitudes of the reflected signals, the radio waves reflected from the a-th antenna during the k-th signalling period has the form:

$$r(t) = \cos(2\pi f_c t + \alpha_{k,a})$$

In particular, the carrier frequency of the reflected, beamformed signal, is $f_c$, the same as the carrier frequency of the incoming RF signal.

Summarizing, the user data to be transmitted is keyed by means of PSK. This means that the phase of the digital wave is changed periodically, the number of possible phases is finite, and each phase encodes an equal number of bits. Each pattern of bits forms a data symbol to be transmitted that corresponds to that particular bit pattern. The phase of the reflected wave at any given antenna is determined by the corresponding antenna impedance, which in turn can be changed by a switch 320, and each switch is controlled by a switch controller 350. The baseband signal generator 340 takes as input the data bits and generates a PSK symbol sequence. The PSK symbol sequence is replicated and the replicas are fed to the switch controllers 350, which operate synchronously. Notice that at each antenna, the only means to modify the phase or amplitude of the reflected wave is by changing the antenna impedance. Therefore, beamforming is accomplished by choosing at each antenna an impedance such that both the desired PSK data symbols are transmitted and the superposition of all the reflections from all antennas creates constructive interference in some desired direction or directions. The purpose of the switch controllers 350 is to modify the incoming PSK symbol sequence and output a possibly different PSK symbol sequence. The output PSK sequence is obtained by modifying the input sequence so that both data transmission by means of phase shift keying and beamforming are simultaneously accomplished. This may be implemented for example by table look-up, as illustrated in Table 2. Each switch controller 350 possesses its own antenna port specific beamforming phase, and receives the PSK symbol sequence from the baseband signal generator 340. Each pair of a PSK symbol and a beamforming phase corresponds to the respective entries in the first and second columns of Table 2. The output from the switch controller 350 is the corresponding entry in the third column (or alternatively the fourth column). Synchronous operation of the switch controllers 350 and of the switches 320 is essential in order to ensure that the reflected waves are beamformed as desired. Thus, all the switch controllers 350 produce output simultaneously and at the same rate, and likewise the switches 320 change state simultaneously and at the same rate. The beamforming phase shifts in the second column of Table 2 are typically determined during a training phase, by methods well known in the art. As an illustration, during a training phase, the impinging RF wave is scattered from one antenna port at time. That is, it is first scattered from a first antenna during a first time period, then it is scattered from a second antenna during a second time period and so on. The receiver can determine the phases that should be imparted to each of the reflections in order to maximize the received SNR, and feeds back this information to the scattering device.

Figure 4:
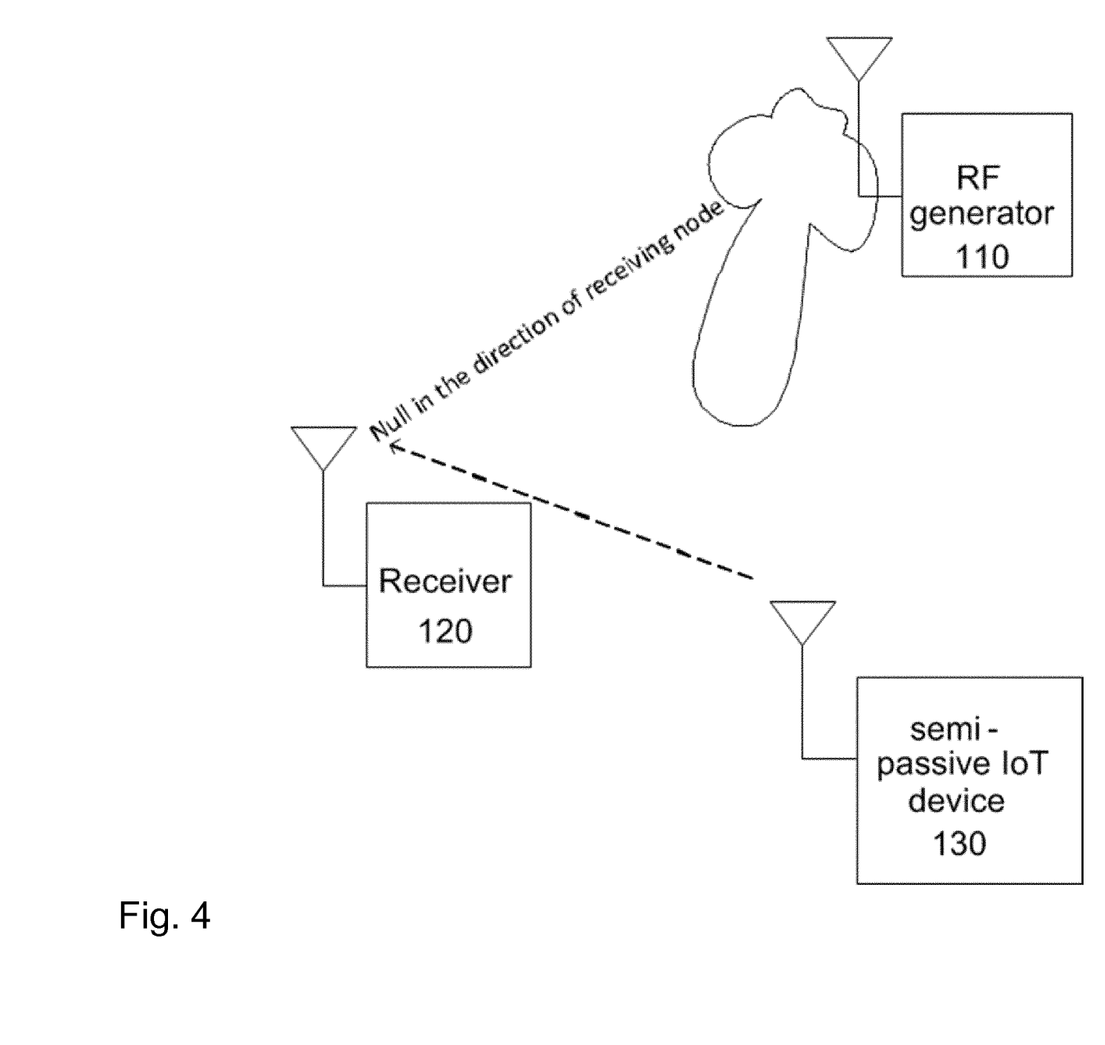
FIG. 4 illustrating a beamforming pattern at an RF generator to decrease interference at a receiver node.

In the embodiment above, the signal generated by the RF generator 110 has the same carrier frequency as signal reflected by the IoT device. Moreover, the output power of the RF generator is larger than the power of the reflected signals. Hence, depending on the path losses, the receiver 120 may experience high interference levels from the RF generator. Note that the RF generator transmits an RF carrier wave that does not carry any useful information. So this problem may be alleviated by applying beamforming at the RF generator 110, as illustrated in FIG. 4. A null is placed in the direction of the receiver 120, thus mitigating the interference from the RF generator 110.

According to one embodiment, the beamformed, reflected waves, may have a carrier frequency different from the carrier frequency of the impinging or incoming RF signal from an RF generator.

The wireless communication node for generating beamforming reflected waves at a frequency different from the frequency of the incoming RF signal has the same structure as shown in FIG. 3 with an example of M=4. Namely a semi-passive or passive device is provided with a plurality A of reflecting antennas 310. Each antenna or more generally, group of antennas or antenna port 310, is coupled to a variable impedance 330 by means of a switch 320. The switch 320 can be in any of M states, corresponding to M different impedances.

However, according to one embodiment herein, a simpler switch with M=2 states may suffice. It will be assumed that it is possible to generate BPSK signals from a reflecting antenna by toggling the two states of the switch. Table illustrates the relation between the antenna impedances, phase shifts, baseband signal and reflected wave from a single antenna. Notice that the baseband signal takes on only two possible values, namely +1 and −1. It is assumed that the impinging RF carrier is of the form $\cos(2\pi f_c t)$, where $f_c$ is the carrier frequency.

TABLE 3

Example of BPSK generation using backscattering and a 2-state switch with one antenna port

| Antenna impedance at time t | Phase shift imparted on reflected wave at time t [rads] | Value of baseband signal x(t) at time t | Reflected wave r(t) at time t |
|---|---|---|---|
| $Z_1$ | 0 | +1 | $\cos(2\pi f_c t)$ |
| $Z_2$ | π | −1 | $-\cos(2\pi f_c t) = \cos(2\pi f_c t + \pi)$ |

With these assumptions, the signal r(t) reflected from one antenna can be written in the form $r(t) = x(t) \cdot \cos(2\pi f_c t)$.

This expression for r(t) highlights the fact that the reflections can be generated by mixing the RF carrier $\cos(2\pi f_c t)$ and the baseband signal x(t), even though there are no mixers or other related RF circuitry. Rather, there is a 2-state switch controlling the antenna impedance, yet the reflected wave r(t) may be expressed as the multiplication of two signals The baseband signal x(t) may be chosen to be an arbitrary square wave taking on the values +1 and −1. In practice the switching speed of the switch will limit the kind of square waveforms that are suitable, i.e. limit the range of Δf. For example, given a frequency Δf and a phase β, one can generate a baseband signal that is a square wave with period $\Delta f^{-1}$ and phase β as follows:

$x(t) = \text{sign}(\cos(2\pi \Delta f t + \beta))$

Here, $\text{sign}(t) = \begin{cases} 1 & \text{if } t \geq 0 \\ -1 & \text{otherwise} \end{cases}$.

To aid the intuition, one may define $e(t) := x(t) - \cos(2\pi \Delta f t + \beta)$, so that $x(t) = \cos(2\pi \Delta f t + \beta) + e(t)$, where the term e(t) has less than 20% of the total signal energy of x(t). Hence, as a rough approximation, one may think of x(t) as a tone with frequency Δf and phase β. Mixing x(t) and $\cos(2\pi f_c t)$ yields two tones, one centered at $f_c - \Delta f$ and another at $f_c + \Delta f$, both having a phase shift β.

Suppose that it is desired to transmit data symbols $\varphi_k \in \text{MPSK}$, k=1, . . . , K, with a symbol period T. The data is beamformed by choosing suitable weights $\theta_a$, a=1, . . . , A. Notice that there is one weight for each antenna port. The baseband signal generator creates a baseband signal $x(t) = \text{sign}(\cos(2\pi \Delta f t + \varphi_k))$, $kT \leq t < (k+1)T$ Then, for each antenna a=1, . . . , A, the baseband signal is given an antenna port specific phase shift $\theta_a$, resulting in an antenna port specific baseband signal $x_a(t)$, i.e. the specific switch control signal, a=1, . . . , A given by $x_a(t) = \text{sign}(\cos(2\pi f t + \varphi_k + \theta_a))$, $kT \leq t < (k+1)T$ Notice that each switch control signal $x_a(t)$ has the value +1 or −1, and modulates the state of the switch #a at time t according to Table 1. In this way, it is possible to beamform signals generated by backscattering using a two state switch at each antenna port.

Summarizing, the baseband signal generator 340 generates a digital wave, i.e. a baseband signal. This wave has a frequency that, together with the frequency of the impinging RF carrier, determines the centres of frequency of the reflected radio waves. Two reflected images are created, one at a frequency higher than the frequency of the impinging RF carrier and the other at a frequency lower than the frequency of the impinging RF carrier. The user data is keyed by means of PSK. This means that the phase of the digital wave is changed periodically, the number of possible phases is finite, and each phase encodes an equal number of bits. Replicas of the baseband signal are fed to a plurality of switch controllers 350 that operate synchronously. Beamforming is accomplished by further changing the phases of each of the replicas according to antenna port specific phase shifts. Each switch controller 350 imparts a phase shift to the incoming baseband signal. This antenna specific phase shift does not convey any information to the receiver. Its purpose is to create constructive interference patterns in some desired directions. These beamforming phase shifts are typically determined during a training phase, by methods well known in the art. As an illustration, during a training phase, the impinging RF wave is scattered from one antenna port at time. That is, it is first scattered from a first antenna during a first time period, then it is scattered from a second antenna during a second time period and so on. The receiver can determine the phases that should be imparted to each of the reflections in order to maximize the received SNR, and feeds back this information to the scattering device. The switch controllers feed the phase shifted digital waves to their respective switches, which in turn toggles the antenna impedances according to the values of the incoming phase shifted digital waves. Synchronous operation of the switches is essential in order to ensure that the reflected waves are beamformed in the desired direction or directions.

As in any multi-antenna system, there will be coupling among antennas, but since the energy re-radiated is only a fraction of the incoming energy, e.g. under 30 dB in 2.4 GHz, this should not pose a practical difficulty.

According to some embodiment herein, each antenna element may be equipped with a reflection amplifier to further boost the reflected signal. Use of reflection amplifiers for backscattering may achieve a gain of approximately 10 dB.

Figure 5:
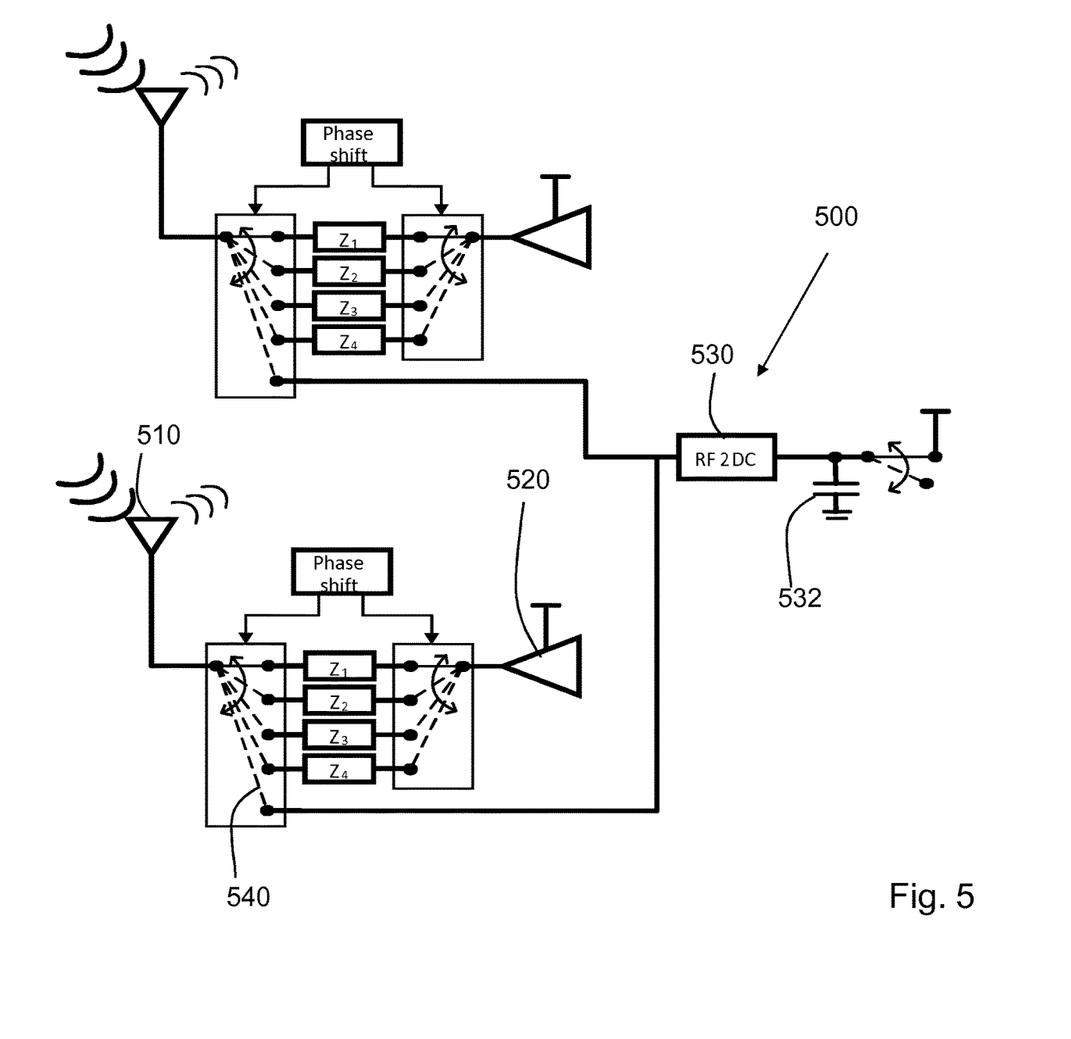
FIG. 5 is a schematic block diagram illustrating combining the antenna elements with reflection amplifiers and energy scavenging.

The reflection amplifiers may be powered from a battery or from an energy scavenging unit 500 as shown in FIG. 5, which may easily be expanded to a structure with any number of antennas. FIG. 5 shows a possible architecture for beamforming by backscattering with 2 antenna elements 510 and using reflection amplifiers 520 combined with RF energy scavenging.

The RF energy scavenging unit 500 comprises an RF to DC power converter (RF2DC) 530, which may be powered from the same RF carrier as is used for backscattering, since the RF carrier then is charging the capacitor 532 while the signal is not being reflected by the antennas. A set of switches 540 is used for controlling the structure in FIG. 5.

The RF energy scavenging may also be powered from another available RF carrier, but in that case it will most likely need another set of antennas.

For the structure in FIG. 5, there is a signal gain both from using beamforming and from having reflection amplifiers. Since all antenna elements may share the same unit for energy scavenging, the cost for adding this is almost constant or at least grows less than linear with the number of antennas.

Therefore, according to some embodiments herein, the wireless communication node 130 may further comprise a plurality A of reflection amplifiers 520 coupled to the plurality A of antennas respectively.

According to some embodiments herein, the wireless communication node 130 may further comprise an energy scavenging unit 500 configured to supply power for the plurality A reflection amplifiers.

According to some embodiments herein, the energy scavenging unit 530 comprises an RF to DC power converter and configured to converter power of an RF signal received at a set of antennas to DC power. The set of antennas may be the same as the plurality A antennas for generating the beamformed signals, then the wireless communication node may further comprise a set of switches 540 configured to control the plurality A antennas for backscattering and energy scavenging.

Figure 6:
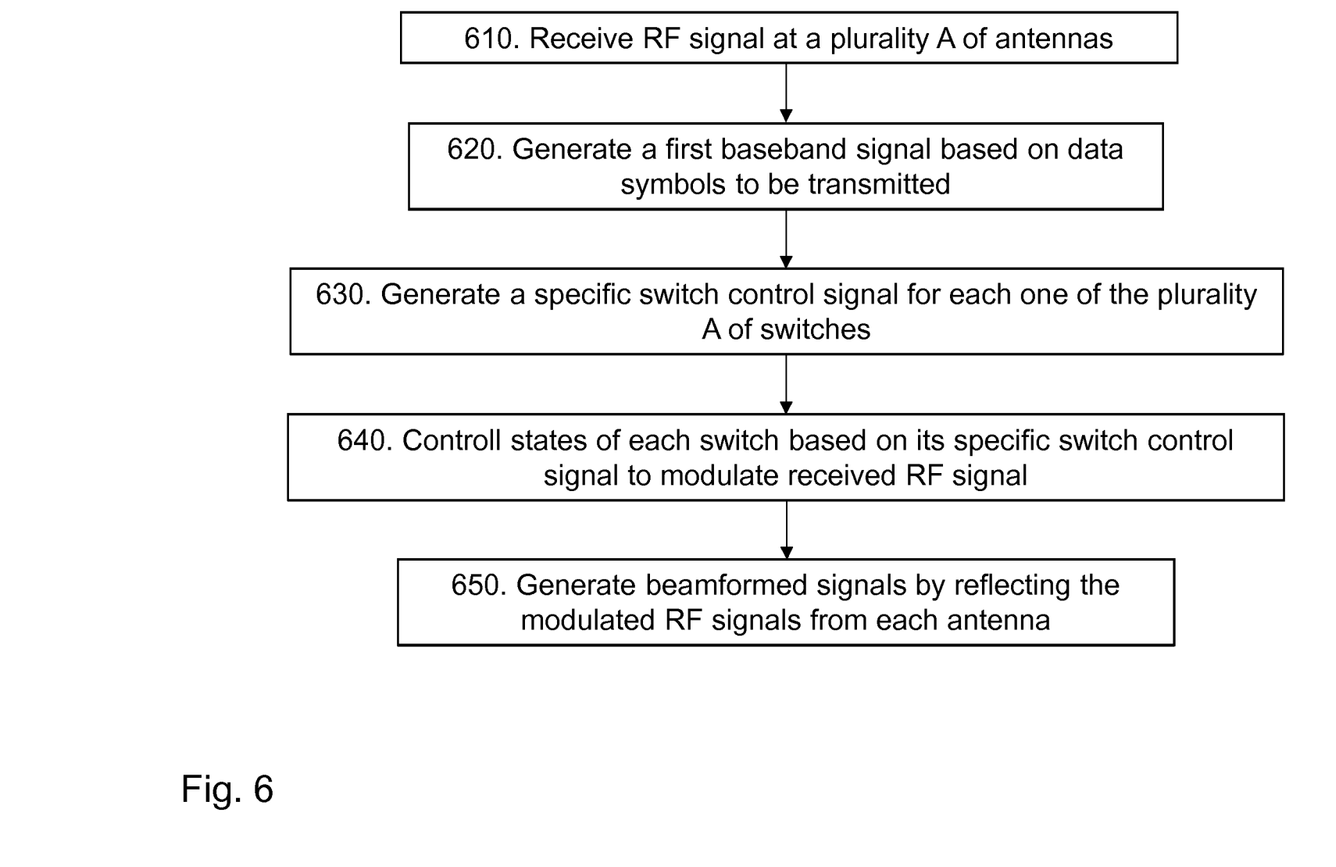
FIG. 6 is a flowchart depicting one embodiment of a method in a wireless communication node.

According to the embodiments herein, a method performed in a wireless communication node for generating beamformed signals by means of backscattering in a wireless communication network is described with reference to FIG. 6. The method comprises the following actions, which actions may be performed in any suitable order.

Action 610

The wireless communication node 300 receives a radio frequency, RF, signal with a carrier frequency ($f_c$) at a plurality A of antennas. A number of impedance matrices each comprising a number M of impedances, are coupled to the plurality A of antennas by a plurality A of switches respectively.

Action 620

The wireless communication node 300 generates a first baseband signal based on data symbols, $\varphi_k$, k=1, ... K, to be transmitted in a baseband signal generator.

Action 630

The wireless communication node 300 generates a specific switch control signal for each one of the plurality A switches by phase shifting the first baseband signal with an antenna specific phase $\theta_a$, a=1, ... A, in a plurality A of switch controllers.

Action 640

The wireless communication node 300 controls the states of each switch based on its specific switch control signal such that each antenna impedance is selected among the number M of impedances to modulate the received RF signal at each antenna by the first baseband signal with its specific phase $\theta_a$.

Action 650

The wireless communication node 300 generates the beamformed signals by reflecting the modulated RF signals from each antenna.

According to some embodiments, the method may further comprise boosting the generated beamformed signals by a plurality A of reflection amplifiers coupled to the plurality A of antennas respectively.

According to some embodiments, the method may further comprise supplying power for the plurality A reflection amplifiers by an energy scavenging unit.

According to some embodiments, the method may further comprise converting power of an RF signal received at a set of antennas to DC power in the energy scavenging unit.

According to some embodiments, the set of antennas is the same as the plurality A antennas for generating the beamformed signals, and the method may further comprise controlling the plurality A antennas for backscattering and energy scavenging by a set of switches.

In the above discussion, it has only been discussed how to obtain the beamforming capability. An essential part for this to be useful is of course related to how to determine in what direction to steer the beam. Since the backscattering transmitter typically would be a very low cost device, and the granularity of the different phases that can be applied to the different antennas, it is envisioned that the training typically would be less complex than usually is the case when beamforming is used. A straight-forward means to do beamforming training is to just transmit the signal using different beam-forming vectors, and based on feedback from the intended receiver, the best one of the evaluated beam direction may be used in the subsequent transmissions.

In case of a very simple device sending small amounts of data, and perhaps only a small set of possible beam-forming vectors, one may even envision the devices sending the data repeatedly using different beam-forming vectors.

In any event, different means to enable effective beam-forming are considered known for the skilled person in the art. Rather, any known way to perform beam-forming is applicable to the embodiments herein.

When using the word "comprise" or "comprising" it shall be interpreted as non-limiting, i.e. meaning "consist at least of".

The embodiments herein are not limited to the above described preferred embodiments. Various alternatives, modifications and equivalents may be used. Therefore, the above embodiments should not be taken as limiting the scope of the invention, which is defined by the appended claims.

The invention claimed is:

1. A wireless communication node for generating beamformed signals by means of backscattering in a wireless communication network comprising:
    a plurality A of antennas configured to receive a radio frequency, RF, signal with a carrier frequency (fc);
    a plurality A of switches, where each switch has a number M of states;
    a number of impedance matrices, each impedance matrix comprises a number of M impedances, and wherein each antenna is coupled to one of the impedance matrix by one of the plurality A switches;
    a baseband signal generator configured to generate a first baseband signal based on data symbols ($\varphi_k$, k=1, ... K) to be transmitted;
    a plurality A of switch controllers, wherein each switch controller is configured to generate a specific switch control signal for one of the plurality A switches by phase shifting the first baseband signal with an antenna specific phase ($\theta_a$, a=1, ... A); and wherein
    the states of each switch are controlled based on its specific switch control signal such that each antenna impedance is changed among the number M of impedances, and thereby the received RF signal at each antenna is modulated by the first baseband signal with its specific phase ($\theta_a$) and reflected, and
    the beamformed signals are generated by the plurality A of antennas by reflecting the modulated RF signals from each antenna.

2. The wireless communication node according to claim 1, further comprising:
    a plurality A of reflection amplifiers coupled to the plurality A of antennas respectively.

3. The wireless communication node according to claim 2, further comprising an energy scavenging unit configured to supply power for the plurality A reflection amplifiers.

4. The wireless communication node according to claim 3, wherein the energy scavenging unit is an RF to DC power converter and configured to converter power of an RF signal received at a set of antennas to DC power.

5. The wireless communication node according to claim 4, wherein the set of antennas is the same as the plurality A antennas for generating the beamformed signals, and the wireless communication node further comprises a set of switches configured to control the plurality A antennas for backscattering and energy scavenging.

6. A method performed in a wireless communication node for generating beamformed signals by means of backscattering in a wireless communication network comprising:
    receiving radio frequency, RF, signal with a carrier frequency (fc) at a plurality A of antennas, wherein a number of impedance matrices each comprising a number M of impedances, are coupled to the plurality A of antennas by a plurality A of switches respectively;
    generating a first baseband signal based on data symbols ($\varphi_k$ k=1, ... K) to be transmitted in a baseband signal generator;
    generating a specific switch control signal for each one of the plurality A switches by phase shifting the first baseband signal with an antenna specific phase ($\theta_a$, a=1, ... A) in a plurality A of switch controllers;
    controlling the states of each switch based on its specific switch control signal such that each antenna impedance is selected among the number M of impedances to modulate the received RF signal at each antenna by the first baseband signal with its specific phase ($\theta_a$); and
    generating the beamformed signals by reflecting the modulated RF signals from each antenna.

7. The method according to claim 6, further comprising boosting the generated beamformed signals by a plurality A of reflection amplifiers coupled to the plurality A of antennas respectively.

8. The method according to claim 7, further comprising supplying power for the plurality A reflection amplifiers by an energy scavenging unit.

9. The method according to claim 8, further comprising converting power of an RF signal received at a set of antennas to DC power in the energy scavenging unit.

10. The method according to claim 9, wherein the set of antennas is the same as the plurality A antennas for generating the beamformed signals, and the method further comprises controlling the plurality A antennas for backscattering and energy scavenging by a set of switches.

* * * * *